United States Patent [19]
Curtin

[11] Patent Number: 5,887,312
[45] Date of Patent: Mar. 30, 1999

[54] CLAMPING ASSEMBLY FOR SQUEEGEE BLADE WITH PIN REFERENCING AND BAR CLAMPING

[75] Inventor: Mark Curtin, Boston, Mass.

[73] Assignee: Transition Automation, Inc., N. Billerica, Mass.

[21] Appl. No.: 713,150

[22] Filed: Sep. 12, 1996

[51] Int. Cl.$^6$ .................................................... B05C 1/02
[52] U.S. Cl. ...................... 15/245.1; 101/123; 15/236.01
[58] Field of Search .......................... 15/236.01, 245.1, 15/256.5; 101/123

[56] References Cited

U.S. PATENT DOCUMENTS

| | | | |
|---|---|---|---|
| 2,359,408 | 10/1944 | Disse | 15/236.01 |
| 3,377,644 | 4/1968 | Budzinski | 15/256.5 |
| 5,044,306 | 9/1991 | Erdmann | 101/123 |
| 5,345,862 | 9/1994 | Giard | 101/123 |

FOREIGN PATENT DOCUMENTS 7800707  7/1979  Netherlands ........................ 15/236.01

*Primary Examiner*—Randall E. Chin
*Attorney, Agent, or Firm*—Samuels, Gauthier, Stevens & Reppert

[57] ABSTRACT

A clamping assembly for a squeegee blade used in solder paste application. The assembly comprises a holder having referencing pins to position the blade. A clamping bar secures the blade to the holder. A recess is formed between the holder and the clamping bar. When a new blade is inserted, any paste contaminating the assembly is pushed into the recess ensuring both accurate blade positioning and clamping force.

5 Claims, 2 Drawing Sheets

CLAMPING ASSEMBLY FOR SQUEEGEE BLADE WITH PIN REFERENCING AND BAR CLAMPING

FIELD OF THE INVENTION

The invention relates to a squeegee blade secured to a squeegee holder for solder paste application.

BACKGROUND AND BRIEF SUMMARY OF THE INVENTION

In the manufacture of circuit boards or cards, a circuit board is placed in a printer. A stencil is secured over the circuit board and a squeegee blade draws a solder paste over the stencil. This forms a pattern which becomes the conductive pattern of the circuit board.

As would be expected, after being used for some time the squeegee blades must be replaced, usually because of wear but also because of damage. In state of the art holders for squeegee blades, such as shown in FIG. 1, a prior art holder 10 is characterized by a stepped surface 14, a squeegee blade 16 having a pair of holes 18, a clamping bar 20 and a pair of threaded fasteners 22. The clamping bar secures the blade 16 to the holder 10. Typically, several fasteners, i.e. 10, are used. Here, only two are shown for clarity.

When the squeegee blade of FIG. 1 must be replaced all the threaded fasteners must be completely removed to release the squeegee blade. When the squeegee holder is open and the parts are separated, solder paste enters onto the surfaces of the holder and clamping bar. If the solder paste is not removed, when the holder is reassembled, the clamping force is reduced because of the presence of the solder paste. Another problem is that solder paste flows on the stepped surface and in the open tapped holes, further complicating blade replacement and most importantly reducing the accuracy of the blade position. It would appear logical that if a squeegee blade is to be replaced that the entire squeegee holder would be disassembled, cleaned and reassembled. In practice, this does not usually occur because it requires considerable time.

The squeegee holder embodied in the present invention does not require total disassembly of the squeegee holder. The squeegee holder is tolerant of paste contamination and incorporates a self-wiping action to insure that the new squeegee blade is clamped accurately to the holder.

Broadly the invention comprises a clamping assembly which is adapted to be secured to a solder paste applicator. The assembly comprises a holder which is characterized by two bearing surfaces, a first bearing surface and a second bearing surface. The second bearing surface has formed therein a pair of tapped holes, adapted to receive threaded fasteners, and a pair of holes adapted to have registration pins received therein. A clamping bar is adapted for mating engagement with the holder and has two pairs of holes in registration with the holes formed in the holder. The first pair of holes are in register with the tapped holes and threaded fasteners pass therethrough to secure the squeegee blade between the holder and the clamping bar. In practice, there would be several pairs of holes, only two pair are shown for clarity.

The other pair of holes are in register with the registration posts such as pins which pass through the holes. The registration pins locate the squeegee blade.

The first bearing surface is offset from the second bearing surface by a stepped surface. When assembled the clamping bar defines a recess with the second bearing surface and the stepped surface. When a new squeegee blade is clamped in place excess solder flows into the recess ensuring the blade is accurately aligned.

BRIEF DESCRIPTION OF THE DRAWINGS

FIG. 4b is a front view of FIG. 4a.

DESCRIPTION OF THE PREFERRED EMBODIMENT(S)

Figure 1:
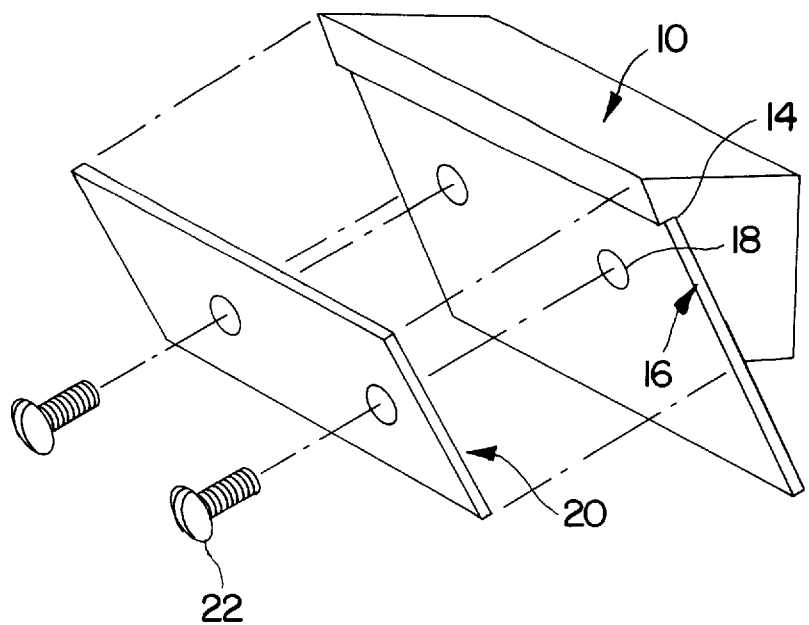
FIG. 1 is an illustration of a prior art squeegee holder.
Figure 2:
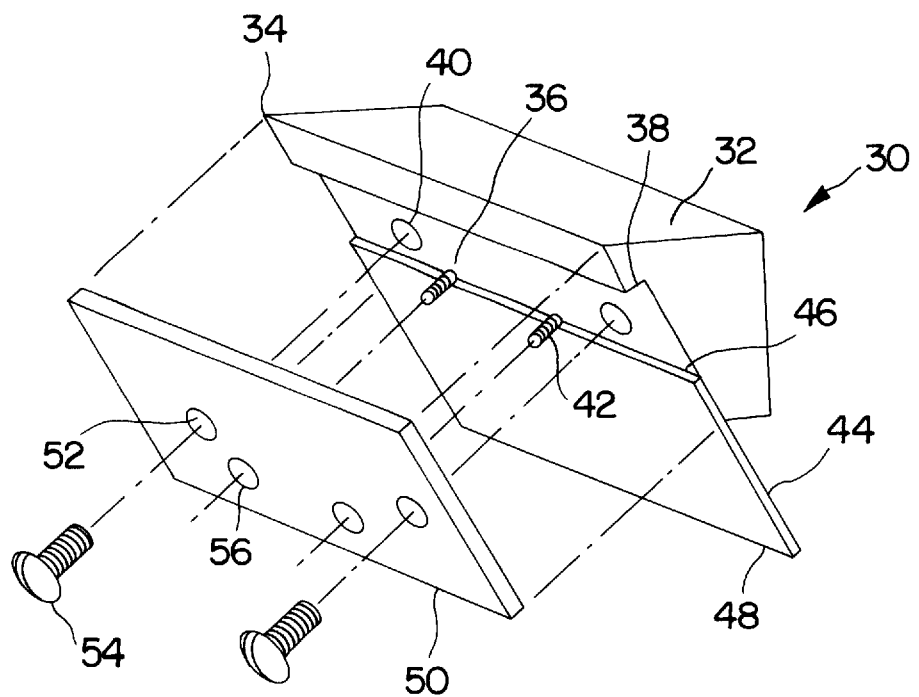
FIG. 2 is an illustration of a squeegee holder of the invention.

Referring to FIG. 2 a clamping assembly of the invention is shown generally at 30 and comprises a holder 32. The holder 32 has a first bearing surface 34 which is offset from a second bearing surface 36 by a stepped surface 38. In the second bearing surface 36 are formed two tapped holes.40. Registration pins 42 are located below the tapped holes 40 and are preferably secured to the bearing surface by being staked in holes (not shown) formed in the bearing surface 36.

As shown, a squeegee blade 44 has an upper edge 46 and a lower edge 48. The upper edge 46 engages the registration pins 42 to position the blade 44 accurately.

A clamping bar 50 comprises a first set of paired holes 52 through which pass threaded fasteners 54 which results in the clamping bar 50, rigidly securing the squeegee blade to the bearing surface 36, and thereby to the holder 32. The pins 42 pass through holes 56 in the plate 50.

Figure 3A:
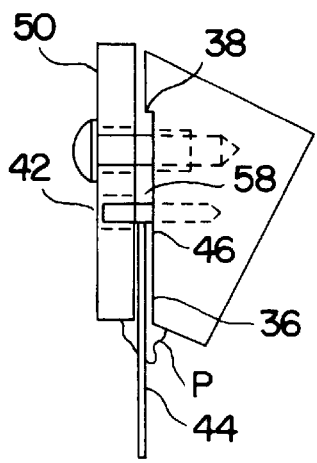
FIG. 3a is side view of FIG. 2.

Referring to FIG. 3a, the squeegee blade 44 and the clamping bar 50 are shown more clearly. The blade 44 is clamped between the bar 50 and bearing surface 36 as shown with its upper edge 46 abutting the registration pins 42. The stepped surface 38 in combination with the surfaces of the bar 50 and the surface 36 not engaged define a recess 58. Solder paste can flow into this recess 58 when a new blade is clamped into position.

Figure 3B:
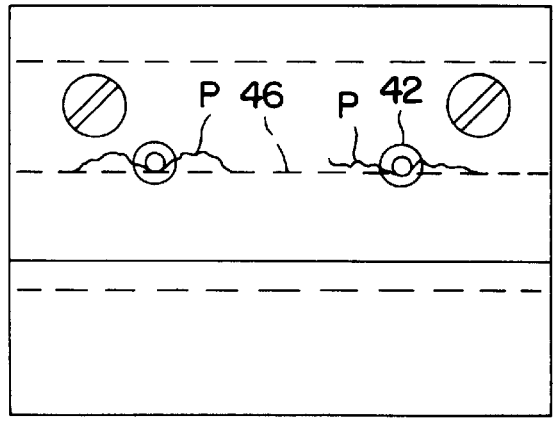
FIG. 3b is a front view of FIG. 2 and illustrates how location of the squeegee blade is not affected by solder paste contamination.

FIG. 3b illustrates how solder paste contamination, P, would be pushed aside (wiped from the pins) into the recess 58 when the upper surface 46 of the squeegee blade 44 engages the registration pins 42.

Figure 4A:
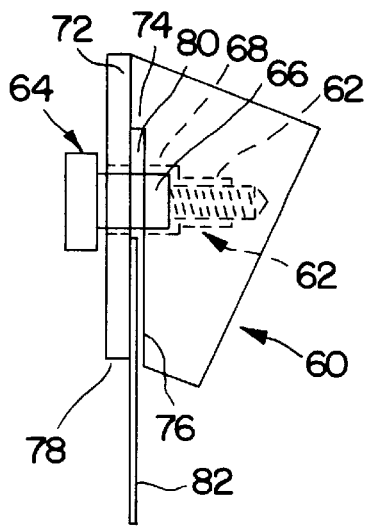
FIG. 4a is a side view of an alternative embodiment of the invention.
Figure 4B:
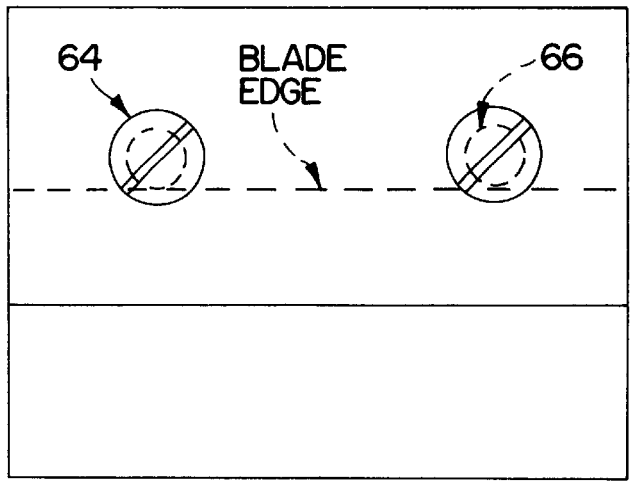

An alternative embodiment of the invention is shown in FIGS. 4a and 4b wherein the registration pins and threaded fasteners of FIG. 2 are combined. A holder 60 comprises a pair of tapped holes 62 (only one shown) in which are received shoulder screws 64. The tapped hole 62 is characterized by an enlarged sleeve section 68.

The shoulder screw 64, characterized by a shoulder 66, is received in the sleeve 68. Similar to the preferred embodiment there is a first bearing surface 72, a stepped surface 74, a second bearing surface 76, a clamping bar 78, a recess 80 and a squeegee blade 82. The shoulder 66 of the screw 64 provides a fixed bearing surface to which the upper edge of the squeegee is pushed into contact. A clearance hole in the clamping bar provides freedom for the clamping bar to secure the blade while not interfering with the shoulder screw. In assembly the shoulder screw 64 is engaged in the tapped hole, the squeegee blade is inserted into a position contacting the lower surfaces of the shoulder screws and the clamping bar is secured.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A clamping assembly for a squeegee blade used in solder paste applications which comprises:

a holder having first and second bearing surfaces, a stepped surface between said first and second bearing surfaces, the first bearing surface lying in a plane offset from the second bearing surface, the second bearing surface having a pair of registration posts extending therefrom, the stepped surface extending at least partially over the posts;

means to secure a clamping bar to the holder; and a solder blade having an upper edge and a lower edge adapted to be received and clamped between the first and second bearing surfaces on one side and the clamping bar on the other side, the upper edge of the solder blade engaging lower surfaces of the posts; the stepped surface, the second bearing surface and the clamping bar defining a recess within which lie the registration posts and where residual solder paste will be pushed when the solder blade is clamped into position.

2. The clamping assembly of claim 1 wherein the means to secure comprises:

a pair of tapped holes formed in the second bearing surfaces, a pair of holes are formed in the clamping bar; and threaded fasteners engage the tapped holes and secure the clamping bar.

3. The clamping assembly of claim 2 wherein the tapped holes are positioned such that they lie within the recess when the solder blade is clamped between the holder and the clamping bar.

4. The clamping assembly of claim 2 wherein the tapped holes comprise:

a relatively enlarged cross-sectional area extending from the second bearing surface to a point intermediate the bottom of the tapped hole and said second bearing surface, and the registrations posts are tubes which are received in the enlarged section of each hole.

5. The clamping assembly of claim 1 wherein the registration posts are pins.

* * * * *